United States Patent [19]
Leger

[11] 4,433,378
[45] Feb. 21, 1984

[54] CHIP TOPOGRAPHY FOR MOS PACKET NETWORK INTERFACE CIRCUIT

[75] Inventor: Geary L. Leger, Mentone, Calif.

[73] Assignee: Western Digital, Irvine, Calif.

[21] Appl. No.: 306,508

[22] Filed: Sep. 28, 1981

[51] Int. Cl.³ .......................... G06F 3/00; G06F 1/00; G06F 13/00

[52] U.S. Cl. .................................................. 364/200

[58] Field of Search ... 364/200 MS File, 900 MS File

[56] References Cited

U.S. PATENT DOCUMENTS

| | | | |
|---|---|---|---|
| 3,892,957 | 7/1975 | Bryant | 364/200 |
| 3,968,478 | 7/1976 | Mensch, Jr. | 364/200 |
| 3,987,418 | 10/1976 | Buchanan | 364/200 |
| 4,090,236 | 5/1978 | Bennett et al. | 364/200 |
| 4,144,561 | 3/1979 | Tu et al. | 364/200 |
| 4,218,740 | 8/1980 | Bennett et al. | 364/200 |

Primary Examiner—Gareth D. Shaw
Assistant Examiner—Daniel K. Dorsey
Attorney, Agent, or Firm—Spensley, Horn, Jubas & Lubitz

[57] ABSTRACT

An optimum chip topography for a MOS LSI packet network interface circuit, including electrical interface and input/output circuitry disposed around the periphery of said chip and forming approximately a quadrilateral framework surrounding the remainder of the circuitry; a read only memory (ROM) disposed in one corner of the interface framework; a microcontroller disposed adjacent to the ROM and along part of a first side of the interface framework; direct memory access (DMA) circuitry disposed adjacent to the microcontroller and in a second corner of the interface framework; transmitter circuitry disposed adjacent to the DMA and microcontroller circuitry and along part of a second side of the interface framework; receiver circuitry disposed adjacent to the transmitter circuitry and in a third corner of the interface framework; data access line circuitry comprising part of a third side of the interface framework, and situated adjacent to the receiver circuitry; timing/counting circuitry disposed adjacent to the receiver circuitry and the data access line circuitry and in the fourth corner of the interface framework; read/write control circuitry comprising part of the fourth side of the interface framework, and situated adjacent to a portion of the receiver circuitry; input/output register circuitry disposed within the interior of the chip and adjacent to the timing/counting circuitry, the read/write control circuitry, the microcontroller, and the ROM; and internal register circuitry disposed within the interior of the chip and adjacent to the input/output register circuitry, the ROM, and the microcontroller. The invention further provides a novel indirect data addressing method and a data buffer allocation method for optimizing the use of the memory and processing resources of a host processor.

4 Claims, 10 Drawing Figures

CHIP TOPOGRAPHY FOR MOS PACKET NETWORK INTERFACE CIRCUIT

BACKGROUND OF THE INVENTION

The present invention is a metal oxide semiconductor (MOS) large scale integrated (LSI) chip for a micro packet network interface circuit (MPAC) having an optimum chip topography, and designed to transmit and receive serial packet information in accordance with the standards specified by the International Telegraph and Telephone Consultative Committee ("CCITT") in its Recommendation X.25. In implementing Recommendation X.25, the present invention employs a novel data addressing and memory buffering scheme that substantially improves the performance of a data communications system incorporating the MPAC chip. This improvement in performance allows the central processing unit (CPU) of the host system to be used more for data processing, and less for communications control.

The MPAC chip is designed to be incorporated into electronic communications circuitry, and to implement a predefined communications protocol and provide an error-free and unambiguous exchange of information between interconnected computers and/or data terminals. The basic functions of the MPAC chip are the establishment and the termination of a logical communications connection, message integrity assurance through error detection and retransmission, the handling of special control functions such as reset and disconnect, and the formatting of information into packets to be transmitted.

In prior art implementations of Recommendation X.25, typically 4 to 6 or more semiconductor chips were required. In addition, software implementing the communications procedures (a "protocol") specified in Recommendation X.25 was required to be developed by the user. Thus, the old method required excessive printed circuit board area and costly software development.

Another problem with prior art implementations of Recommendation X.25 is that the CPU must directly attend to providing data to be transmitted, or to storing received data, on a relatively continuous basis.

The present invention overcomes the prior art problems by implementing the protocol specified in Recommendation X.25 in a single pre-programmed MOS LSI circuit. Hence, the user need not be concerned with the details of the packet switching network protocol. Furthermore, the present invention conserves printed circuit board area, and also reduces electrical power requirements.

The present invention also employs a novel indirect addressing scheme that allows the CPU to designate to the MPAC circuit, by means of "lookup" tables, areas in the system memory for storing data to be transmitted or received. Thereafter, the MPAC circuit accesses those areas by means of a direct memory accessing technique, while the CPU resumes its data processing functions. In conjunction with the indirect addressing scheme, the MPAC circuit also employs a memory buffering technique that substantially reduces the amount of system memory that need be dedicated for use by the MPAC circuit.

However, merely designing a circuit to perform a function is not sufficient to ensure that it will be economical to manufacture the circuit as a MOS LSI chip. The primary consideration in the economical manufacture of MOS LSI circuits is minimizing the amount of substrate material (such as silicon) required to produce an integrated circuit chip, thus allowing a greater chip yield per substrate wafer.

The surface geometry of the MOS circuitry is formed on a chip and the interconnection pattern of conductors therebetween must be optimized to provide the highest functional component density in order to reduce overall chip area per circuit function. Minimum geometry spacings between metallization lines, diffused regions, and polycrystalline silicon conductors must be maintained, yet the length of such lines and their associated capacitances must be minimized in order to optimize circuit performance as the complex interconnection patterns are implemented. Parasitic electrical effects on the circuitry also must be minimized or compensated for in the chip layout. A very high degree of creativeness is thus required of the chip architect in order to choose a particular layout and interconnection pattern for an LSI circuit from the very large number of possibilities that exist for arranging such a circuit. Frequently, the commercial success of a MOS LSI product may hinge on the ability of a chip architect to achieve an optimum chip topography.

By creatively structuring the topographic layout of the MPAC chip, the present invention allows a MOS LSI chip size of 266 mils by 263 mils, with a processing speed of up to 1.6 megabits per second, or even more. The preferred embodiment of the present invention is fabricated in N-channel, self-aligned silicon gate MOS technology, and is TTL compatible on all inputs and outputs.

It is therefore an object of this invention to provide a packet network interface circuit having a novel data addressing and memory buffering scheme that substantially improves the performance of a data communications system using the circuit.

It is another object of this invention to provide an optimum semiconductor chip topography for a MOS LSI chip implementation of the standards specified in CCITT Recommendation X.25.

It is a further object of this invention to provide an optimum chip topography for a MOS LSI packet network interface circuit.

It is yet a further object of this invention to provide a bonding pad sequence for a MOS LSI MPAC chip selected to allow optimum arrangement of packages containing the MPAC chip on a printed circuit board.

SUMMARY OF THE INVENTION

The present invention is a single chip MOS LSI implementation of CCITT Recommendation X.25, an international standard for bit-oriented packet switching network data communication systems. In particular, the present invention implements Level 2 of Recommendation X.25. Level 2 specifies the data link access procedure for data exchange across a logical communications link between data terminal equipment (DTE) and data circuit-terminating equipment (DCE). (Level 1 of Recommendation X.25 specifies the physical and electrical interface standards for packet switching networks). Recommendation X.25 describes two types of Level 2 operation: a link access procedure (LAP), and a link access procedure balanced (LAPB). The present invention can implement either of these procedures by changing the micro-programming stored in the read-only memory of the MPAC chip.

The present invention is typically incorporated into a computer system having a CPU and a System Memory. The CPU typically communicates with the MPAC chip and the System Memory via a CPU Bus. The system architecture is designed to allow either the CPU or the MPAC chip to access the System Memory as needed.

The Level 2 protocol of Recommendation X.25 is a link level procedure specifically designed to ensure error free and unambiguous information exchange between interconnected computers or terminals. The present invention implements the transmission functions specified in Level 2 by accessing from the System Memory a block of data bits (or information field) designated by the CPU to be transmitted, and then automatically appending certain information and control fields to ensure that the information field is properly transmitted and received without error. The information field and the fields appended by the MPAC circuit together constitute a packet (also known as an information frame or I-frame). The resulting packet is then serially transmitted over a physical communications link.

The data receiving functions specified in Level 2 and implemented by the present invention consist of receiving a serial bit stream comprising a packet, converting the packet into a parallel format, checking the information and control fields for correctness to determine the integrity of the received packet, and storing the information field of the packet in an area of the System Memory previously designated by the CPU.

A packet is formed by preceding an information field with a flag field, an address field, and a control field, and following the information field with a frame check sequence field and a terminating flag field. The format and content of each of the fields appended by the MPAC circuit to the information field accessed by the MPAC circuit are rigidly defined by Recommendation X.25.

The MPAC chip also automatically generates two types of control frames containing information necessary to establish, maintain, or terminate a logical communications connection, and to acknowledge received packets. The format and content of each type of control frame generated by the MPAC circuit are rigidly defined by Recommendation X.25.

In implementing Recommendation X.25, the present invention employs a novel memory access method for addressing the System Memory in order to access information fields to be transmitted and to store information fields received. The present invention also employs a novel memory buffering technique that conserves a substantial amount of System Memory when using the MPAC chip in a communications system.

The problem involved is that under the present Recommendation X.25, up to seven packets may be outstanding in each direction in a communications link. Thus, the MPAC circuit must provide for the transfer of packets in both directions to the physical communications link and must keep account of unacknowledged packets previously transmitted. In addition, the MPAC circuit should access the information fields designated by the user's CPU in a manner that does not require supervision by the CPU.

The present invention solves this problem by using dual-channel direct memory access (DMA) and a memory access method using two sections, or tables, of data recorded in the System Memory by the CPU. These data tables contain the System Memory addresses of the information fields and also contain certain control information relating to the individual packets to be sent or received. One of these "lookup" tables contains transmit information, and the other contains receive information. The CPU transmits to the MPAC chip only the address of the lookup tables contained in the System Memory. The MPAC chip accesses the contents of the lookup tables as needed. The MPAC circuit uses the address information stored in the lookup tables to access, via its DMA channels, the locations in the System Memory where the actual information fields are to be read from (for transmission purposes) or written into (for receive purposes). Thus, the user's CPU can designate the locations in the System Memory of information fields to be transmitted or where received information fields are to be stored by transmitting to the MPAC chip only the address in the System Memory of the lookup tables, instead of transmitting (or receiving) each information field to the MPAC chip itself. Since the CPU need not handle each incoming or outgoing packet (a slow speed process, since all packet transmissions are bit serial), the processing speed of the system is therefore enhanced by this indirect addressing method.

A second problem involved in implementing Recommendation X.25 is the efficient allocation of System Memory resources. The problem stems from the fact that although the user defines the maximium length allowed for any information field, the information field of many packets may be of a much lesser length. In addition, up to eight information fields may be involved in any particular transmission sequence. Rather than allocating the maximum amount of System Memory space needed if all information fields were of maximum length, under user control the MPAC circuit can treat an information field as comprising a number of small, equal-length segments. The user allocates within the System Memory enough space to accommodate the first segment of each of the eight information fields that possibly have to be dealt with at any one time. The user also allocates within the System Memory a number of Overflow Buffer Blocks, each capable of storing a segment of an information field. All of the primary segment memory areas and the Overflow Buffer Blocks also contain within them transfer information.

In operation, if an information field is longer than the primary segment memory area to which it is allocated, the MPAC circuit accesses the transfer information at the end of the primary segment memory area (after using as much of that area as possible for the information field). The transfer information enables the MPAC circuit to access an Overflow Buffer Block for additional storage area. If the first Overflow Buffer Block accessed is insufficient to accept the remainder of the information field, the transfer information contained therein is used by the MPAC circuit to logically "chain" a second Overflow Buffer Block to the end of the first Overflow Buffer Block. Further "chaining" of Overflow Buffer Blocks is possible, until the length of the longest possible information field is accommodated. The chaining function of the MPAC circuit may be used in the transmit mode as well as in the receive mode.

In implementing the MPAC circuit functions in MOS LSI circuitry, an optimum chip topography was developed. The topography design minimizes the amount of substrate material required for each integrated circuit chip by optimizing the size-limiting parameters common to MOS processing technology. The MPAC chip topography developed includes electrical interface and input/output circuitry disposed around the periphery of said chip and forming an approximately quadrilateral framework surrounding the remainder of the circuitry; a read only memory (ROM) disposed in one corner of the interface framework; a microcontroller disposed adjacent to the ROM and along part of a first side of the interface framework; direct memory access (DMA) circuitry disposed adjacent to the microcontroller and in a second corner of the interface framework; transmitter circuitry disposed adjacent to the DMA and microcontroller circuitry and along part of a second side of the interface framework; receiver circuitry disposed adjacent to the transmitter circuitry and in a third corner of the interface framework; data access line circuitry comprising part of a third side of the interface framework, and situated adjacent to the receiver circuitry; timing/counting circuitry disposed adjacent to the receiver circuitry and the data access line circuitry and in the fourth corner of the interface framework; read/write control circuitry comprising part of the fourth side of the interface framework, and situated adjacent to a portion of the receiver circuitry; input/output register circuitry disposed within the interior of the chip and adjacent to the timing/counting circuitry, the read/write control circuitry, the microcontroller, and the ROM; and internal register circuitry disposed within the interior of the chip, and adjacent to the input/output register circuitry, the ROM, and the microcontroller.

BRIEF DESCRIPTION OF THE DRAWINGS

Like numbers in different figures refer to like elements.

DESCRIPTION OF THE INVENTION

Figure 1:
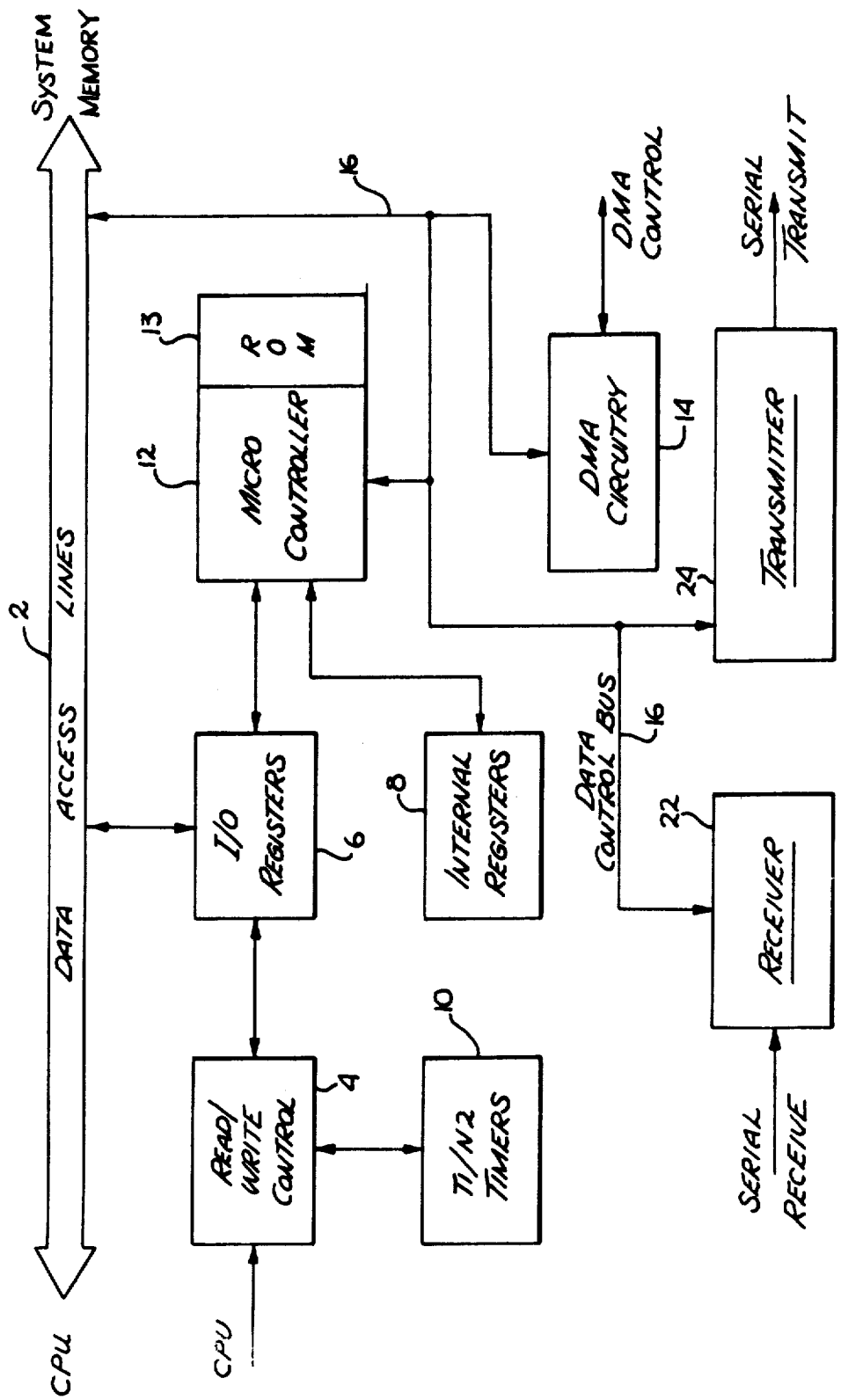
FIG. 1 is a block diagram of an MPAC circuit according to the invention.

Referring to FIG. 1, there is shown a block diagram of a preferred embodiment of an MPAC circuit implementing the protocol specified in Level 2 of Recommendation X.25 published by the CCITT. The MPAC circuit includes data access lines (DAL) 2, read/write control circuitry 4, input/output (I/O) registers 6, internal registers 8, T1/N2 counter circuitry 10, a microcontroller 12, a read only memory (ROM) 13, DMA circuitry 14, a data/control bus 16, receiver circuitry 22, and transmitter circuitry 24.

Connections between the subcircuits are made by means of buses comprised of separate conductors. The buses themselves vary in width from one separate conductor to 29 separate conductors. Because of the great number of conductors required in implementing the Recommendation X.25 Level 2 functions, particular care must be taken in laying out the MOS LSI circuitry comprising the present invention.

The data/control bus 16 couples much of the internal circuitry of the MPAC chip. As shown in FIG. 1, the data/control bus 16 interconnects the data access lines 2, the microcontroller 12, the DMA circuitry 14, the receiver circuitry 22, and the transmitter circuitry 24.

The user's CPU controls the mode and monitors the status of the MPAC circuit through the read/write control circuitry 4. By means of control commands exchanged with the read/write control circuitry 4, the CPU reads from or writes into the sixteen I/O registers 6, which are individually addressed by the CPU through address inputs IA0–IA3.

Information to be transmitted or that has been received by the MPAC circuit is transferred between the System Memory and the MPAC chip via the eight data access lines 2 (DAL0–DAL7). The circuitry of the data access lines 2 includes multiplex circuitry to provide for bidirectional communication over the same input/output pins, in known fashion.

The microcontroller 12 provides for overall control of the MPAC circuitry. Micro-instructions for the microcontroller 12 are stored in the read only memory (ROM) 13, which is organized as an array of memory locations 11-by-1024 bits in size.

The internal registers 8 are used by the MPAC circuit to store intermediate status and control information.

Figure 2:
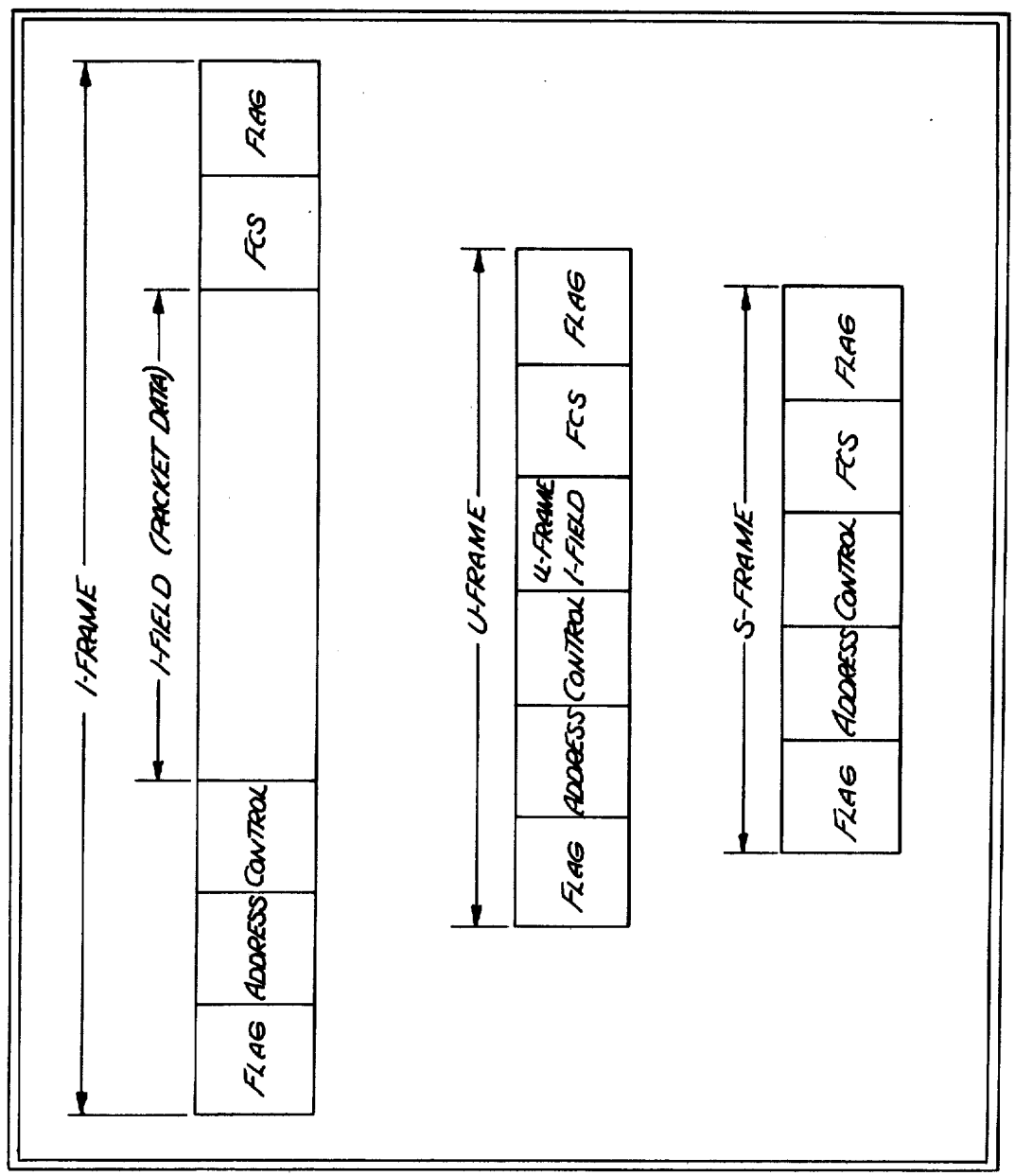
FIG. 2 is a diagram of the types of packet formats used with the present invention.

The MPAC circuit is capable of transmitting and/or receiving three different types of frames: information frames (I-frames or packets), supervisory frame (S-frames), and unnumbered frame (U-frames). Frames generally may be of two sub-types: command frames and response frames. The format of these frames is shown in FIG. 2.

The S-frame is used to perform link supervisory control functions such as the acknowledgement of I-frames, requests for retransmissions of I-frames, and requests to temporarily suspend transmission of I-frames. As shown in FIG. 2, an S-frame is composed of five fields, the first and fifth of which are 8-bit flags. A flag is defined as the binary sequence "01111110". A single flag may be used as both the closing flag for one frame and the opening flag for the next frame. Between flags, any sequence of five continuous binary "1's" must have a binary "0" inserted immediately thereafter. This process, often called "bit stuffing", guarantees that information occurring in between the beginning and ending flag of a frame will not be mistaken for a flag.

The second field of an S-frame is an address field of eight bits. At present under Recommendation X.25, the address field can be either of the binary numbers "00000011" or "00000001"; the choice between the two is determined by the requirements of Recommendation X.25. If the MPAC chip is used in a DTE environment, the user's CPU stores the number "00000001" in Register E and the number "00000011" in Register F of the I/O Registers 6. If the MPAC chip is used in a DCE environment, the above register assignments are reversed. The MPAC circuit also allows the user to define and store in Registers E and F other binary sequences for the address field so that other communication modes not covered by Recommendation X.25 can be accommodated.

The third field of the S-frame is an 8-bit control field, the states of which are defined by Recommendation X.25 and generated by the MPAC circuitry. The fourth field of the S-frame is a frame check sequence ("FCS") field consisting of sixteen bits of cyclic redundancy check information. The FCS calculation includes all data between the opening flag and the first bit of the FCS field, except for binary "0's" inserted for bit stuffing purposes. The FCS field is calculated in accordance with well-known principles, using the polynomial set forth in Recommendation X.25.

The I-frame format contains the same fields as the S-frame, but further includes an information field (I-field) between the control field and the FCS field, as shown in FIG. 2. I-frames are always considered to be command frames. The contents of the I-field are defined by the user upon transmission of a packet and constitute the data the user desires to transmit. The length of an I-field may be any multiple of eight bits. The MPAC obtains the contents of the I-field from the System Memory through the MPAC DMA circuitry 14. The control field of each I-frame also contains a sequence number called N(s). The sequence number N(s) is used to number I-frames so that a station receiving an I-frame may acknowledge that I-frame without ambiguity.

The U-frame is used to provide additional link control functions. The format of the U-frame is nearly identical the format of the I-frame. However, the control field of a U-frame has no sequence number, and all but one type of U-frame have no I-field. That type, a Frame Reject (FRMR) (which is also called a Command Reject (CMDR)), is a U-frame which has a special three byte I-field, and is solely used for reporting error conditions. The possible states of a U-frame are defined in Recommendation X.25 and generated by the MPAC circuitry. U-frames are used to set up, disconnect, and reset communications links.

The first two bits of the 8-bit control field in any frame type identify the frame as either a U-frame, an S-frame, or an I-frame. An important feature of the MPAC circuit is that all S-frames and U-frames, and all fields of I-frames except the I-field, are automatically generated and tested by the MPAC circuit.

The transmitter circuitry 24 contains a small microcontroller within it. The transmitter circuitry 24 performs several functions, in accordance with the requirements of Recommendation X.25. In particular, the transmitter circuitry 24 automatically (a) appends a beginning and ending flag to each frame, (b) inserts a "0" after any five contiguous "1's" occurring between a beginning flag and an ending flag, (c) generates FCS fields, (d) generates address fields, and (e) generates control fields.

The receiver circuitry 22 also performs several functions. As the serial stream of bits comprising a frame are received by the MPAC circuit, the receiver circuitry converts the serial data stream into a parallel format twenty-four bits at a time. The receiver circuitry 22 automatically tests the address field and control field of each received frame for proper sequence and control commands. The receiver circuitry also automatically strips away any "0's" inserted in a packet for bit-stuffing purposes, and tests the validity of the received 16-bit FCS field. If the FCS field and the address fields are valid, no transmission error has occurred. The MPAC circuit therefore transmits the sequence number of the received packet to the sending circuit, thereby acknowledging receipt of that packet. If the FCS field or the address field is invalid, a transmission error has occured and the MPAC circuit automatically signals the sending circuit to retransmit the invalid packet (and all subsequent packets transmitted, if any).

The T1/N2 counter circuitry 10 contains two timing/counting circuits. The T1 timing/counting circuit a user-programable (through Registers #8 and #9 of the I/O Registers 6) timer/counter that counts out a minimum time interval before a retransmission of an unacknowledged command frame is required. The N2 counter counts the number of times a command frame is retransmitted because the T1 timer ran out without the command frame being acknowledged. The N2 counter is compared against a user-programable (through Register #9 of the I/O Registers 6) standard that determines the number of times the retransmission process will be attempted the MPAC circuit before an error interrupt is generated and transmitted to the host CPU for user-defined control processing.

Two additional parameters implemented in the MPAC circuit are N1 and K. N1 is a user-defined parameter designating the maximum number of bits in an I-frame; its value thus depends on the maximum length of the I-field since all other fields are fixed in length. The parameter K is the maximum number of sequential I-frames, or packets, that the MPAC circuit may have outstanding (transmitted but unacknowledged) at any given time. The parameter K is set at seven under Recommendation X.25.

In theory, the MPAC chip could perform the functions defined by Recommendation X.25 if the CPU transmitted to the MPAC chip, byte-by-byte, an information field to be incorporated into a packet and serially transmitted by the MPAC, or if the CPU received, byte-by-byte, an information field from a packet that had been serially received by the MPAC and "unpacked". However, since the MPAC chip transforms a serial bit stream into a parallel format when acting as a receiver, and transforms a parallel information format into a serial bit stream when acting as a transmitter, it would wasteful of CPU time and resources to require the CPU to attend to the MPAC on a byte-by-byte basis. Hence, the MPAC chip provides a direct memory access (DMA) circuit 14 designed to minimize the time required for the CPU to communicate with the MPAC chip.

The control for the DMA circuit 14 in the MPAC chip is simple, requiring only three pins (DRQI, DRQO, and DACK) for hand-shake communication control with the CPU Bus. The DMA function of the MPAC chip is fast since there are sixteen address output pins (A0–A15) which are separate from the eight data access lines 2 (DAL0–DAL7), thereby obviating any need to time-division mulitplex address and data information over one set of input/output pins. Thus, DMA transfers from the System Memory to the MPAC chip occur in a single system cycle. Since it is necessary for the MPAC circuit to handle transmit and receive information simultaneously (i.e., full duplex operation) on two DMA channels, the DMA circuit 14 architecture employs the well-known "cycle-stealing" structure and technique in conjunction with a novel memory access method.

The novel memory access method of the present invention uses two "lookup" tables, one for transmit ("TLOOK") and the other for receive ("RLOOK"), located in the System Memory of the CPU host processor which controls the MPAC chip. These tables contain addresses and transmit/receive control information for information fields.

As an initial step in the DMA operation of the MPAC circuit, the CPU transmits a 16-bit System Memory starting address for the lookup tables to the MPAC chip. Half of the starting address is loaded into Register A and half is loaded into Register B of the I/O Registers 6. Since the two lookup tables, TLOOK and RLOOK, are contiguous areas the System Memory, only one starting address is necessary. Both TLOOK and RLOOK each have a total of eight segmented control sections, each control section containing eight bytes. Four bytes of each control section are used for a System Memory starting address and the length of an I-field, one byte contains control bits, and the other three bytes are open for user definition.

When transmitting an information field, the MPAC circuitry will access TLOOK and from the first control section read the starting address and length of the first I-field to be transmitted. The MPAC chip will then automatically generate and transmit appropriate flag, address, and control fields. Next, the MPAC chip will use its "transmit" DMA channel to access the I-field data in the System Memory, using the first starting address accessed from TLOOK. At the end of the I-field (determined by the length information obtained from TLOOK), the MPAC circuit will automatically generate and transmit the frame check sequence field and the terminating flag field. The MPAC circuit will then access the next control section in TLOOK, obtain the address and length of the next I-field to be transmitted, and then prepare and transmit a packet containing that I-field. This process may continue for up to eight I-fields (corresponding to the eight control sections of TLOOK) before the CPU needs to load new control data into TLOOK. However, the user may choose to have the CPU load new control data into TLOOK at any time before the maximum number of control sections have been accessed by the MPAC chip.

Under the standards set by Recommendation X.25, up to seven I-frames or packets may be transmitted before the first is acknowledged by the receiving station. If a receiving station does not acknowledge a transmitted packet within the time specified by the T1 parameter, retransmission of the missing packet and all subsequent packets is necessary. If retransmission of one or more (up to seven) I-fields is required, the MPAC circuit will automatically retrace, in the manner described above, the previous series of transmissions. The user's CPU does not become involved in any retransmissions. However, an error counter at the end of RLOOK is incremented by the MPAC chip. The error counter may be accessed by the CPU for user-defined control processing.

When the MPAC chip is in the receiving mode, each incoming frame is checked for correct address and frame check sequence fields, and for the type of control field. If the frame is an I-frame, the I-field is placed in the System Memory beginning at the address located in the first control section of the RLOOK table. Storing of the I-field from incoming packets into the System Memory is performed through a second, "receiving" DMA channel that timeshares with the "transmit" DMA channel the data access lines 2 and the address output pins (A0–A15). The length of the received I-field is stored in RLOOK in the first four bytes of the corresponding RLOOK control section.

After a packet is received error free and in proper sequence, an interrupt signal is generated and the MPAC circuit is ready for the next incoming packet, the I-field of which will be stored in a similar manner in the System Memory at the address indicated in the next control section of the RLOOK table. This process may continue for up to eight I-fields (corresponding to the eight control sections of RLOOK) before the CPU needs to load new control data into RLOOK. However, the user may choose to have the CPU load new control data into RLOOK before the maximum number of control sections have been accessed by the MPAC chip.

Following contiguously in the System Memory after the RLOOK table are six eight-bit error counters for the MPAC chip implementing the LAPB procedure, and seven eight-bit error counters for the MPAC chip implementing the LAP procedure. These error counters do not cause an error interrupt to the CPU, but maintain a running count of error activity noted by the MPAC circuit that may be read by the CPU and acted upon as desired by the user.

Because the length of an information field is user defined, and because up to eight I-fields may be involved during any particular transmission sequence, a problem could exist in the efficient allocation of the System Memory, particularly in the receive mode. For example, if a portion of the System Memory were allocated to the MPAC on the assumption that the I-field of each received packet could be of maximum length, but in fact relatively small I-fields were common, there would result a significant inefficiency in memory usage. Thus, if an I-field could be as large 1024 bytes, but many packet I-fields contained only four to five bytes, a total System Memory size of $8 \times 1024$, or 8192, bytes would still need to be dedicated to receiver memory. This inefficient allocation of System Memory would be aggravated if there were several MPAC chips sharing the System Memory in a multi-channel network system.

To resolve this problem, a data chaining feature is provided in the MPAC circuit. The user defines two parameters, LIMIT and CHAIN, which are loaded into Register C of the I/O Registers 6. The LIMIT parameter defines the maximum byte length of an allowable subportion ("block") of an I-field. The CHAIN parameter defines the total number of blocks.

To use the chaining function of the MPAC circuit, the user's CPU sets up in the System Memory one or more Overflow Buffers. Each Overflow Buffer in the System Memory consists of one or more Overflow Buffer Blocks each having a length equal to the LIMIT parameter. The additional two bytes included in the LIMIT parameter are located at the end of each Overflow Buffer Block and function as a transfer address referring, or "pointing", to the address of a next Overflow Buffer Block. A series of these logically connected Overflow Buffer Blocks is known as a "chain". The total number of blocks that may be chained together is equal to the CHAIN parameter.

In addition to allocating space for the Overflow Buffers, the user's CPU also sets up in the usual fashion eight primary data receiving blocks, the addresses of which are contained in RLOOK. However, each of the primary data receiving blocks is also assigned a 2-byte transfer address. Each transfer address acts as a pointer to the location in the System Memory of a succeeding Overflow Buffer. Thus, for example, if the parameter LIMIT is set at 128 bytes, and the parameter CHAIN is set at eight blocks, and two Overflow Buffers are desired, the CPU would allocate in the System Memory a total of eight primary receiving blocks each 128 bytes long (including their respective 2-byte transfer address), with two Overflow Buffers each comprising eight Overflow Buffer Blocks of 128 bytes each. Hence, the total memory allocation for the receive mode would be 3,072 bytes (including transfer addresses) instead of the 8,192 bytes necessary in the absence of the chaining function.

In operation, if an incoming I-field is longer than the primary data receiving block addressed by RLOOK, the MPAC circuit transfers as much of the I-field as possible to the primary data receiving block. The MPAC circuit then uses the 2-byte transfer address from the end of the primary data receiving block to access the first Overflow Buffer Block from one of the Overflow Buffers. A further portion of the I-field is then transferred to the first Overflow Buffer Block. If more transfer space is required to fully accommodate the I-field, the MPAC circuit uses the transfer address at the end of the first Overflow Buffer Block to logically "chain" a second Overflow Buffer Block to the logical end of the first one. Further "chaining" of Overflow buffer Blocks is possible, until the length of the maximum I-field possible is accommodated.

The above example assumes that, on average, only two (the number of Overflow Buffers) out of any eight packets would have I-field lengths greater than the LIMIT parameter. In the event that the I-fields of more than two of any eight packets do exceed the LIMIT parameter length, the MPAC circuit generates an error interrupt to the CPU, which would then load new address information into the table.

Although the chaining function has been described with respect to the receive mode of the MPAC circuit, it may also be used in the transmit mode in a manner essentially as described above. That is, an I-field with a length greater than the primary data transmitting block addressed by TLOOK is loaded into the primary data transmitting block plus one or more Overflow Buffer Blocks. The MPAC circuit uses the transfer addresses in the primary data transmitting block to access the I-field subportions located in each Overflow Buffer Block, until the total number of bytes specified in the corresponding TLOOK control section are transmitted.

Figure 3:
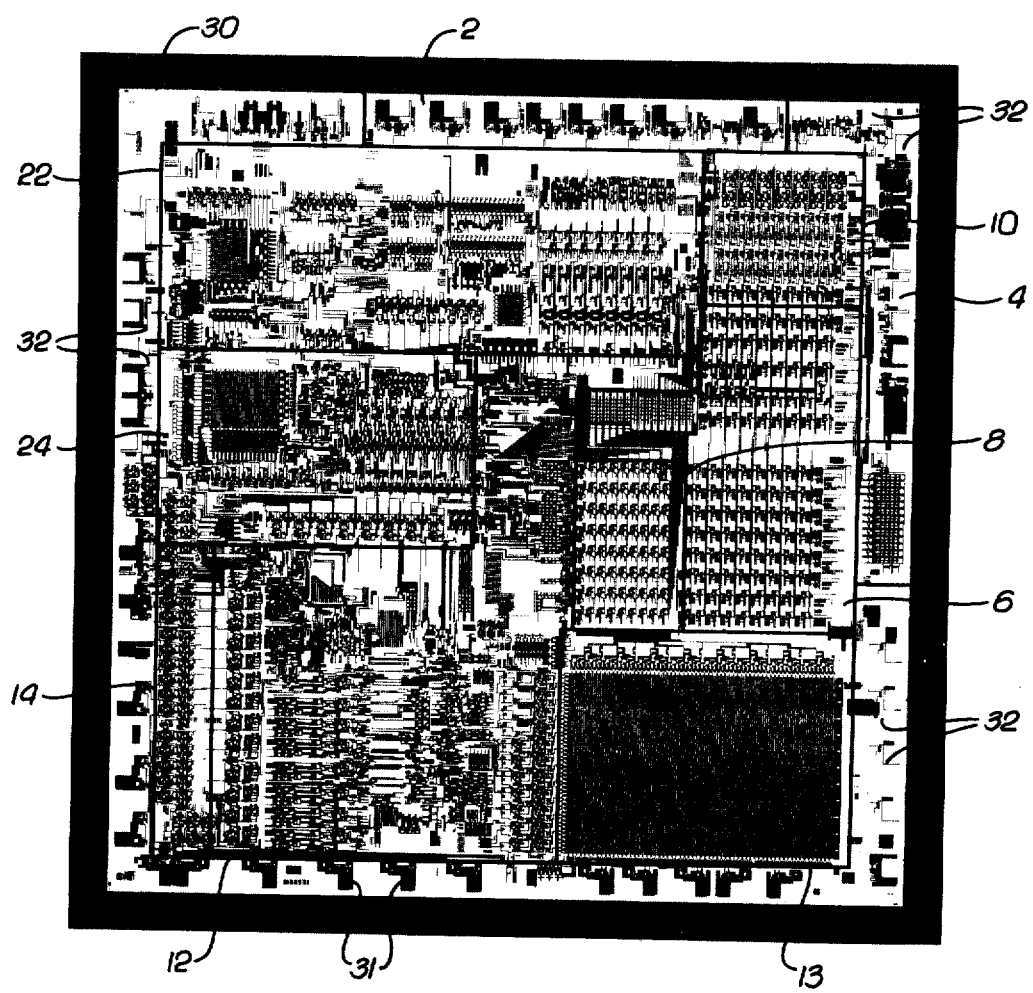
FIG. 3 is a block diagram illustrating the general location on a semiconductor chip of an MPAC circuit according to the invention.

Referring now to FIG. 3, illustrated is the general location on a semiconductor chip of the MPAC circuitry. In particular, the periphery 30 of the chip is used for the bonding pads 31 necessary to couple the MPAC chip to I/O pins in an external package in conventional fashion, and for the circuitry comprising the interface circuitry 32. The interface circuitry 32 located around the periphery of the MPAC chip is necessary to make the output signals from the MPAC chip electrically compatible with external circuitry, and the input signals of external circuitry electrically compatible with the MPAC chip. In the preferred embodiment of the MPAC chip, the interface circuity 32 enables the NMOS circuitry of the MPAC chip to interface with TTL logic levels.

Within the approximately quadrilateral framework formed by the interface circuitry 32, the remaining portions of the MPAC circuit are positioned. Located within the framework of the interface circuitry 32 are the following subportions of the MPAC circuit: the ROM 13 is disposed in one corner of the interface circuitry 32; the microcontroller 12 is disposed adjacent to the ROM 13 and along part of a first side of the interface circuitry 32; the DMA circuitry 14 is located adjacent to the microcontroller 12 in a second corner of the interface circuitry 32 and along part of a second side thereof; the transmitter circuitry 24 is situated adjacent to the microcontroller 12 and DMA circuitry 14, and along part of a second side of the interface circuitry 32; the receiver circuitry 22 is located adjacent to the transmitter circuitry 24 in a third corner of the interface circuitry 32 framework and along part of a third side thereof; the data access lines 2 comprise a part of the third side of the interface circuitry 32, and are situated adjacent to the receiver circuitry 22; the T1/N2 counter circuitry 10 is disposed adjacent to the receiver circuitry 22 and the data access lines 2, and in the fourth corner of the interface circuitry 32 framework; the read/write control circuitry 4 comprises a part of the fourth side of the interface circuitry 32, and is disposed adjacent to a portion of the receiver circuitry 22; the I/O registers 6 are located within the interior of the MPAC chip adjacent to the T1/N2 counter circuitry 10, the ROM 13, the microcontroller 12, and the read/write control circuitry 4; and the internal registers 8 are disposed within the interior of the MPAC chip adjacent to the I/O registers 6, the ROM 13, and the microcontroller 12.

Figure 10:
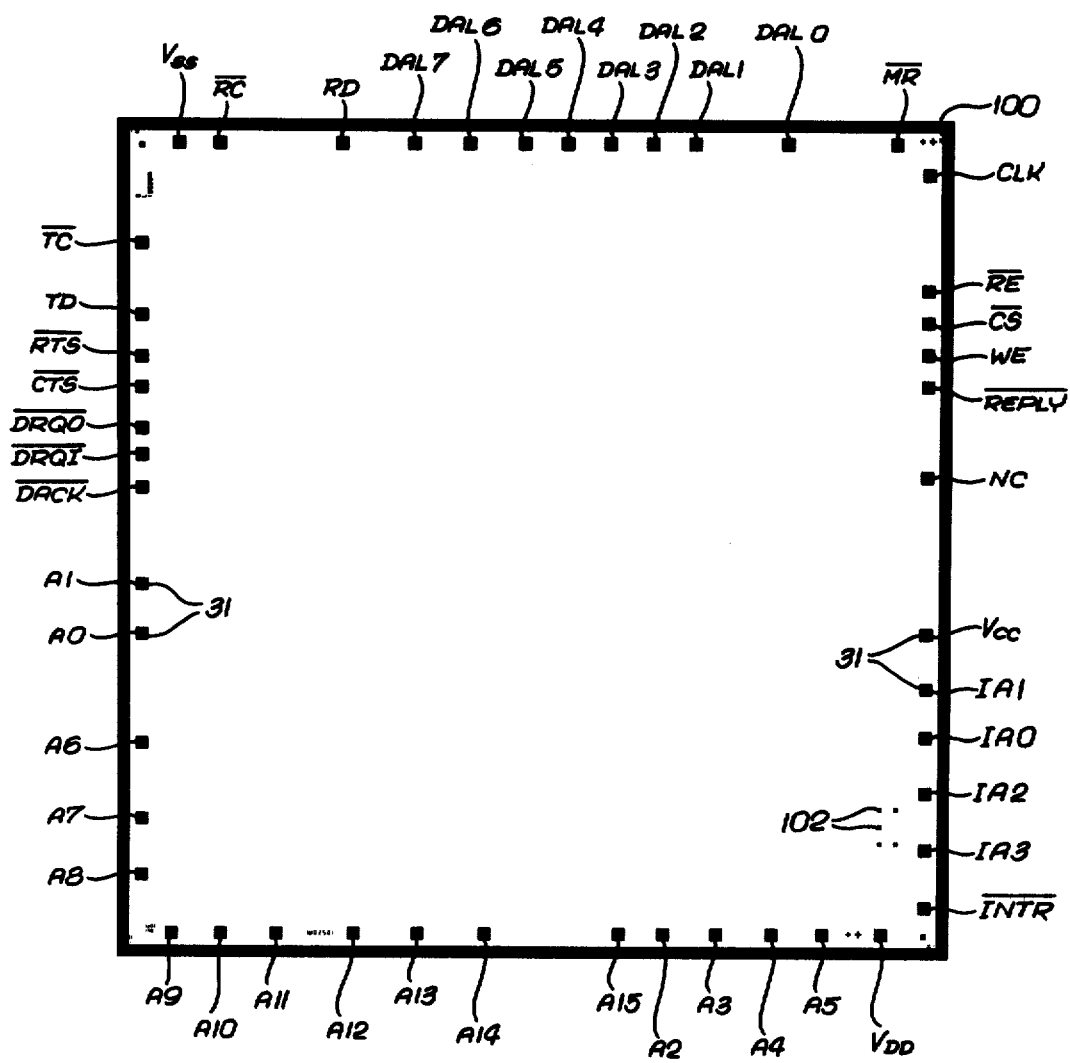
FIG. 10 is a scale drawing of a photomask used to define and isolate the chip bonding pads while the remainder of the chip is protectively coated during the manufacture of MOS MPAC circuit according to the invention.

Referring now to FIG. 10, the bonding pads 31 for the MPAC chip are arranged around the periphery 30 of the chip in an order particularly well suited for housing the MPAC chip in a 48-pin dual-in-line package within the conventional requirements for bonding lead lengths and angles. In the present embodiment, beginning with the upper right hand corner of FIG. 10 and proceeding clockwise, the bonding pad and pin order of the MPAC chip is set forth in the following table, along with the names of the corresponding signal lines:

| SIGNAL | NAME |
| --- | --- |
| CLK | Clock |
| $\overline{RE}$ | Read Enable |
| $\overline{CS}$ | Chip Select |
| $\overline{WE}$ | Write Enable |
| $\overline{REPLY}$ | Reply |
| NC | (no connection) |
| $V_{CC}$ | +5VDC Power Supply |
| IA1 | Address Line In 1 |
| IA0 | Address Line In 0 |
| IA2 | Address Line In 2 |
| IA3 | Address Line In 3 |
| $\overline{INTR}$ | Interrupt Request |
| $V_{DD}$ | +12 VDC Power Supply |
| A5 | Address Line 5 |
| A4 | Address Line 4 |

| SIGNAL | NAME |
|---|---|
| A3 | Address Line 3 |
| A2 | Address Line 2 |
| A15 | Address Line 15 |
| A14 | Address Line 14 |
| A13 | Address Line 13 |
| A12 | Address Line 12 |
| A11 | Address Line 11 |
| A10 | Address Line 10 |
| A9 | Address Line 9 |
| A8 | Address Line 8 |
| A7 | Address Line 7 |
| A6 | Address Line 6 |
| A0 | Address Line 0 |
| A1 | Address Line 1 |
| $\overline{DACK}$ | DMA Acknowledge |
| $\overline{DRQI}$ | DMA Request In |
| $\overline{DRQO}$ | DMA Request Out |
| $\overline{CTS}$ | Clear-To-Send |
| $\overline{RTS}$ | Request-To-Send |
| TD | Transmit Data |
| $\overline{TC}$ | Transmit Clock |
| $V_{SS}$ | Ground |
| RC | Receive Clock |
| RD | Receive Data |
| DAL7 | Data Access Line 7 |
| DAL6 | Data Access Line 6 |
| DAL5 | Data Access Line 5 |
| DAL4 | Data Access Line 4 |
| DAL3 | Data Access Line 3 |
| DAL2 | Data Access Line 2 |
| DAL1 | Data Access Line 1 |
| DAL0 | Data Access Line 0 |
| $\overline{MR}$ | Master Reset |

The sequence of the pins of the MPAC chip is chosen to provide maximum utility in placing the MPAC chip on a circuit board. It should be noted with respect to FIG. 10 that the $V_{CC}$, $V_{DD}$, $V_{SS}$ voltage supply pins are not symmetrically located on the package, so that if the package is inserted backwards into a printed circuit board and power applied, damage to the MPAC chip may be avoided. The separation of the voltage supply pins shown in FIG. 10 reduces the likelihood of shorting them together. It is also desirable that the eight data access lines be sequentially numbered and located on one side of the MPAC chip so that conductors on the printed circuit board can be easily routed and connected to the CPU and System Memory.

Figure 4:
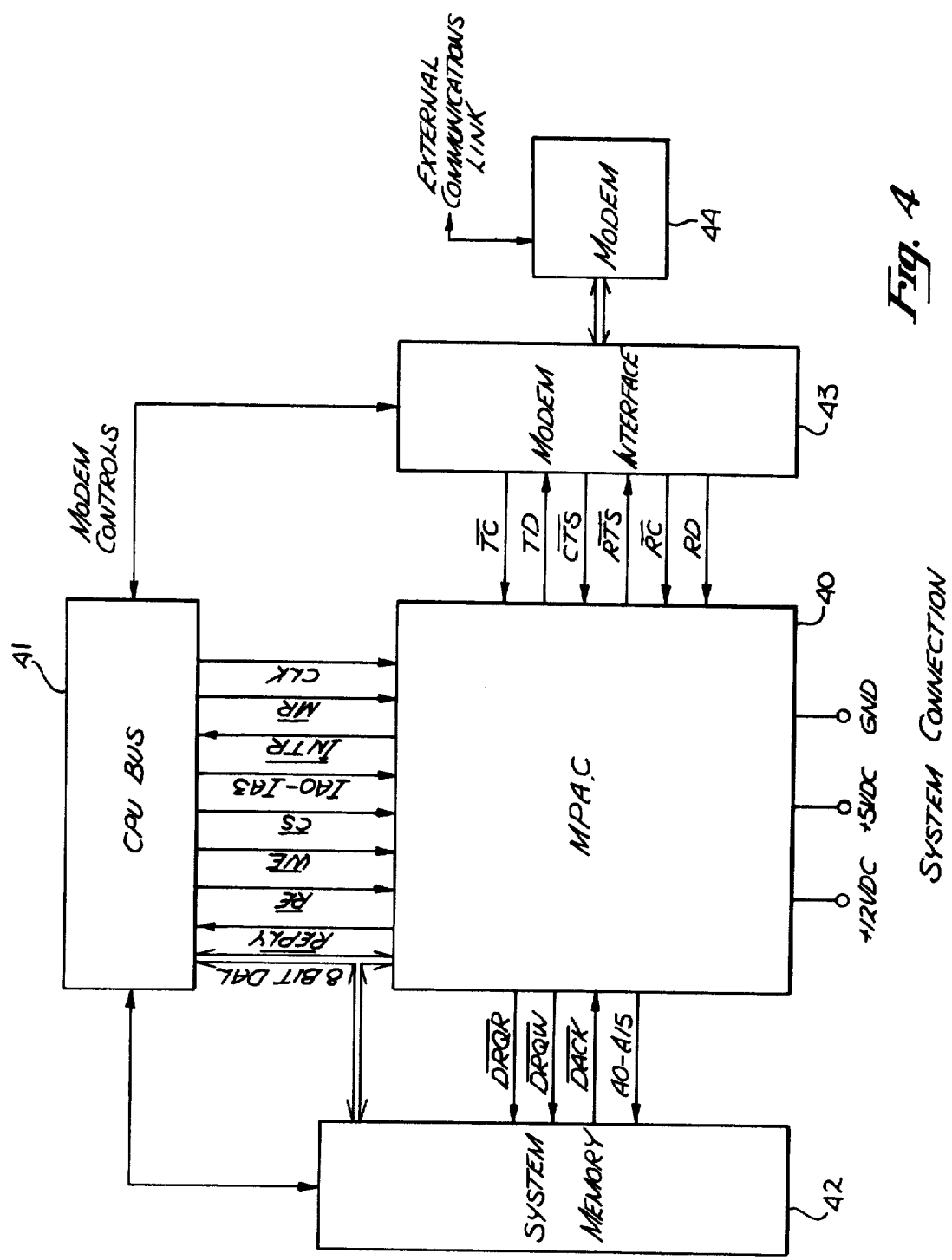
FIG. 4 is a block diagram illustrating the present invention connected in a communications system.

Referring now to FIG. 4, shown is a block diagram illustrating the MPAC chip 40 connected in a typical communications system. As can be seen from FIG. 4, the MPAC chip is coupled to the CPU Bus 41 by pins CLK, $\overline{MR}$, $\overline{INTR}$, IA0, IA1, IA2, IA3, $\overline{CS}$, $\overline{WE}$, $\overline{RE}$, $\overline{REPLY}$, and the eight Data Access Line pins (DAL-0–DAL7). The MPAC chip is also coupled to the System Memory 42 by pins DAL0–DAL7, and by the three DMA control signal pins $\overline{DRQO}$, $\overline{DRQI}$, and $\overline{DACK}$, and the sixteen Address lines A0–A15. A Modem Interface circuit 43 is coupled to the MPAC chip by pins $\overline{TC}$, TD, $\overline{CTS}$, $\overline{RTS}$, RC, and RD. The Modem Interface 43 adapts the signals to and from the MPAC chip to the physical and electrical requirements of the physical communications link (here, a modem 44). The Modem Interface 43 is typically also coupled to the CPU Bus 41 for control purposes.

To complete the connections of the MPAC chip in a typical communications system, pins $V_{DD}$, $V_{CC}$, and $V_{SS}$ are coupled to an appropriate power supply.

Figure 5:
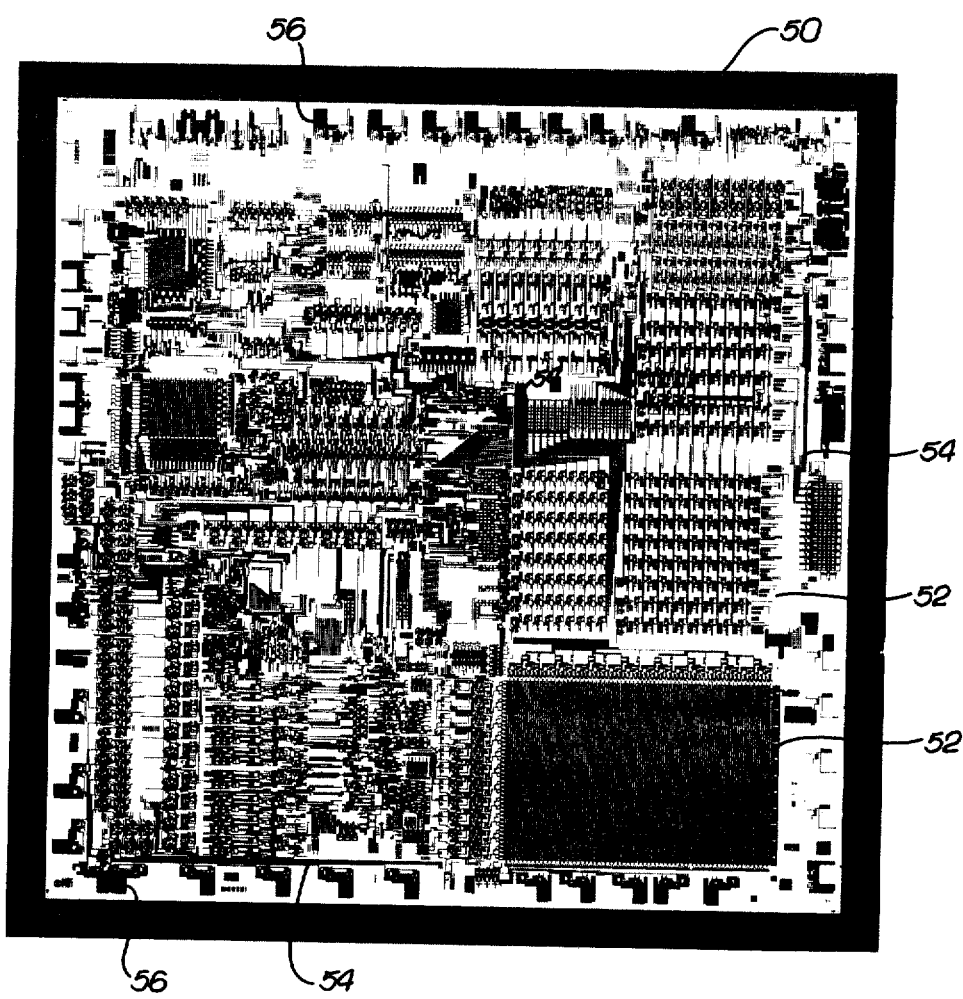
FIG. 5 is a scale drawing of a photomask utilized to pattern the substrate layer in which the source-drain and interconnect diffusion areas are subsequently formed in the manufacture of a MOS MPAC circuit according to the invention.

Referring now to FIG. 5, there is shown a drawing of the source-drain definition mask 50 utilized in manufacturing the preferred embodiment of the invention by means of the well known N-channel self-aligned silicon gate MOS manufacturing process. The pattern of dark regions on the chip, such as area 52, designate areas where the source, drain, and channel regions of the MOS field effect transistors (FET's) comprising the MPAC chip circuitry are to be subsequently formed. The long, slender lines, such as area 54, designate areas where diffused conductors are to be subsequently formed. Also shown are the source-drain definition patterns 56 for a portion of the circuitry required for the interface control circuitry, and the input and output lines to the MPAC chip.

Figure 6:
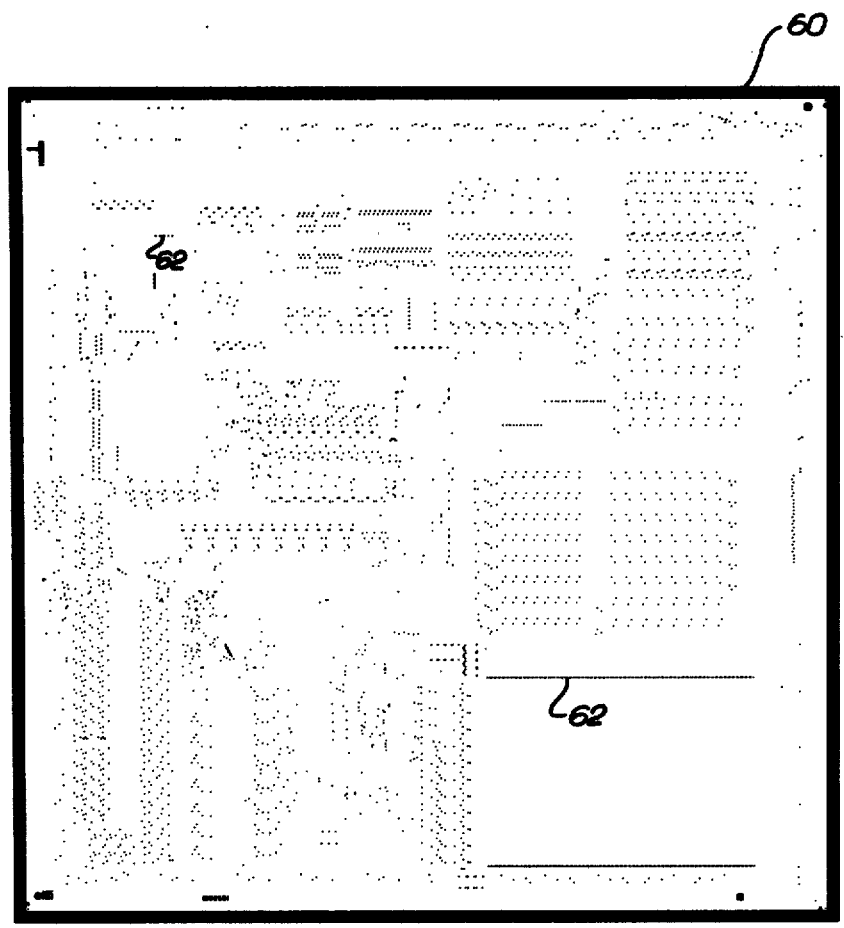
FIG. 6 is a scale drawing of a photomask used to form contacts between a polycrystalline silicon layer and diffusion areas in the manufacture of a MOS MPAC chip according to the invention.
Figure 7:
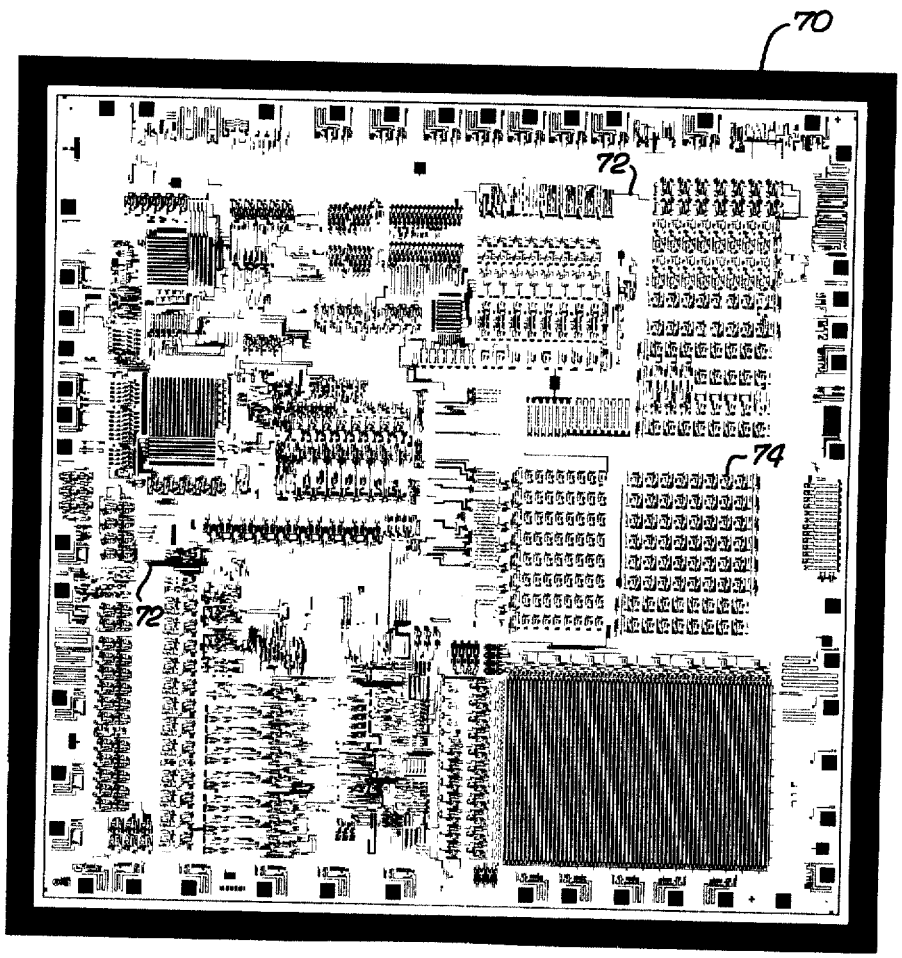
FIG. 7 is a scale drawing of a photomask used to pattern the polycrystalline silicon layer of a MOS MPAC circuit according to the invention.

The source-drain definition mask 50 is used to etch patterns in field oxide grown on a P-type silicon substrate which forms the basic structure of the entire MPAC chip. After the field oxide is patterned using the source-drain definition mask 50, a thin gate oxide is grown over the entire chip area. This thin gate oxide is then patterned by the diffusion contact mask 60 illustrated in FIG. 6. The dark areas (such as 62) of the diffusion contact mask 60 indicate where polycrystalline silicon-to-diffused region contacts are to be made. After these contact holes are formed in a conventional manner, polycrystalline silicon is deposited over the entire chip structure. The polycrystalline silicon is then patterned using the polymask 70 shown in FIG. 7, which defines the gate electrodes of the FET's that form the active devices comprising the MPAC circuitry, and also defines polycrystalline interconnection lines. For example, the long, thin lines 72 are polycrystalline conductors utilized as interconnectors, and do not act as FET gate electrodes. The dark regions, such as 74, represent FET gate electrodes.

Figure 8:
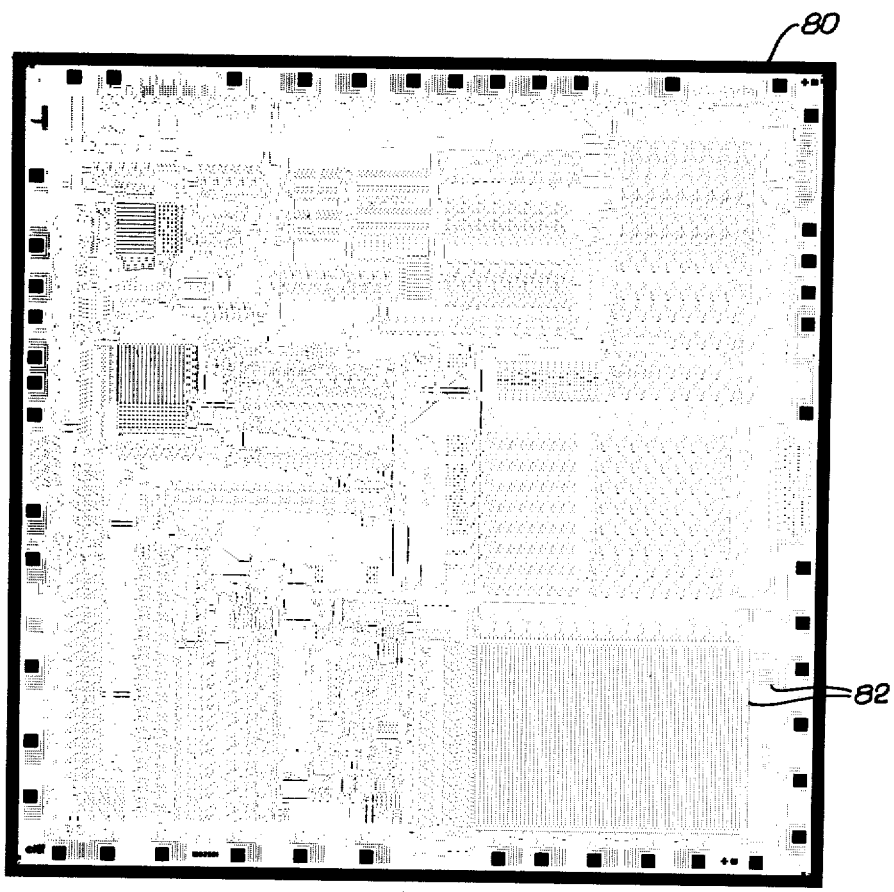
FIG. 8 is a scale drawing of a photomask used to define the pattern of the preohmic contacts that connect a metallized layer to the polysilicon layer and to the source-drain diffusion areas during the manufacture of a MOS MPAC circuit according to the invention.

After the MPAC chip is patterned with the polymask 70, the entire chip is diffused with N+ material in a conventional manner to complete the formation of the self-aligned silicon gate FET's. Thereafter, silicon oxide is deposited over the entire chip to act as a insulating protective layer. The silicon oxide coating is then etched with the pattern of the preohmic mask 80 shown in FIG. 8. The dark areas of the preohmic mask 80, such as 82, define contact points to the polycrystalline silicon conductors and diffusion layer conductors. These contact points will connect to a metal layer that is subsequently applied to the chip.

Figure 9:
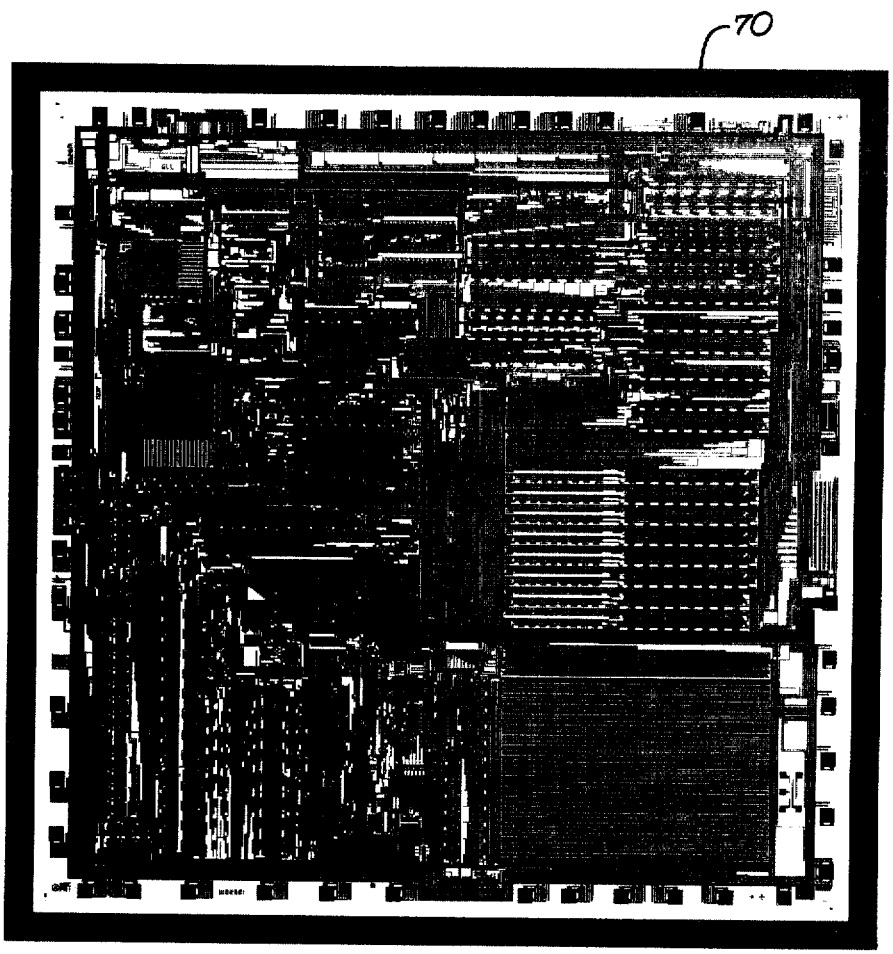
FIG. 9 is a scale drawing of a photomask used to pattern the metal interconnection layer of a MOS MPAC circuit according to the invention.

After etching the MPAC chip with the preohmic mask 80, the entire chip is coated with a metallic layer, which is then patterned by conventional etching techniques with the metal interconnect mask 90 shown in FIG. 9. The pattern of the metal interconnect mask 90 defines the final level of device interconnection on the MPAC chip.

As a last step, the protection mask 100 disclosed in FIG. 10 is used to define all the areas on the MPAC chip that are not to be coated with a protective oxide coating. The bonding pads areas 31 of the chip are masked off by the protection mask 100 so that they will not be covered with the protective coating, thereby ensuring that the bonding properties of the pad areas 31 remain unaffected. Also masked off from the subsequently applied protective coating are several test points 102 used for test probes during the production and testing of the MPAC chip.

The information disclosed by FIGS. 5 through 10 illustrates the geometry and interconnections of all of the MOS FET's comprising the MPAC circuit described as the preferred embodiment herein. It will be noted in reviewing FIGS. 5 through 10, but in particular FIGS. 5 and 7, that many of the mask patterns forming the MOS FET's and their interconnections are highly symmetric. This symmetry is due primarily to the use of a repetitive cell structure in the design of this LSI chip, which is an important consideration because of the substantial savings in lay-out time achieved by use of such cells. Further, there is a substantially reduced probablity of art work error when repetitive cells are used instead of utilizing a custom approach to the art work of each cell. On the other hand, use of standard cells for all of the logic of a MOS LSI chip is very unlikely to optimally utilize the chip area. However, creative use of some repetitive cells in combination with custom art work for other sections of a chip may provide an optimum topology which will make possible a high chip yield from each substrate wafer, provide for good circuit electrical performance, and require a minimal amount of silicon substrate per chip.

A very high level of creativity is required of the chip architect in designing MOS LSI chip circuitry because of the layout constraints for state-of-the-art manufacturing processes. For example, for self-aligned silicon gate MOS manufacturing processes, the major constraints are the minimum width and spacings of the diffused regions, the minimum size required for preohmic openings and the spacings required from the edge of the peripheral preohmic openings to the edge of the diffused regions, the minimum width and spacing of polycrystalline silicon lines and the fact that such lines cannot cross over diffused regions, the minimum width and spacing between metal lines, and the fact that the conductors in the same layer or in uninsulated adjacent layers cannot cross over like conductors. The high amount of capacitance associated with diffused regions and the resistance of both diffused lines and polycrystalline silicon lines (and to a lesser extent of metal lines) provide further constraints on the chip architect. For logic circuits which may be characterized as random logic designs, such as that of the subject invention, a large number of interconnection lines between sections of logic circuitry are required, and the very large number of possibilities for routing the various kinds of conductors to the various required sections of the chip taxes the ingenuity of the most competent chip topology designer and the capacity of the most sophisticated computer routing programming available. Computer aided design (CAD) programs have been applied to computerize random logic MOS LSI layouts for a number of years. However, CAD programs have been successful only to the extent that it provides rapid prototype circuit designs having rather mediocre performance and producing uneconomically large semiconductor chips. It is well established that the CAD programs currently available do not come close to matching human ingenuity in providing MOS LSI chip architectures or minimized logic designs which provide optimum performance while utilizing minimal substrate area. The exercise of a high level of creativity in the design of MOS LSI chips thus results in economic reward of substantial measure.

While the invention has been described with reference to a preferred embodiment thereof, those skilled in the art will recognize that changes in form and placement of parts may be made to suit various requirements within the scope of the invention.

What is claimed is:

1. A metal oxide semiconductor (MOS) chip for a micro packet network interface circuit (MPAC) implementing a preselected packet network switching protocol, for use in conjunction with an external central processing unit (CPU) having a system memory, and for communicating with external communications circuitry, said MPAC comprising:
   (a) chip interface circuitry adapted to couple said MPAC to signal lines of external circuitry;
   (b) read/write control circuitry coupled to said CPU through said chip interface circuitry, for receiving control signals from and control sending signals to said CPU;
   (c) timing/counting circuitry coupled to said read/write control circuitry, for indicating when a certain event has occurred and for counting the number of times said certain event has occurred;
   (d) input/output (I/O) registers coupled to said read/write control circuitry, for storing control information received from said CPU through said read/write control circuitry;
   (e) a microcontroller coupled to said I/O registers, for regulating the functions of the MPAC;
   (f) read only memory (ROM) coupled to said microcontroller, for storing microinstructions used by said microcontroller;
   (g) internal registers coupled to said microcontroller, for temporarily storing information for said microcontroller;
   (h) a data control bus coupled to and controlled by said microcontroller, for routing control signals and data signals among certain circuitry of said MPAC;
   (i) data access lines coupled to said CPU and said system memory through said chip interface circuitry, and to said I/O registers and said data control bus, for receiving information and transmitting information between said CPU and/or said system memory, and said data control bus and/or said I/O registers;
   (j) direct memory access (DMA) circuitry coupled to said data control bus, and to said system memory through said chip interface circuitry, for accessing information from said system memory through said data control bus independently of said CPU;
   (k) receiver circuitry coupled to said data control bus and to a serial input from said external communications communications circuitry through said chip interface circuitry, for receiving serial data from said external circuitry, for converting said serial data into a parallel format and verifying the validity of said data, and for making said data available to said data control bus;
   (l) transmitter circuitry coupled to said data control bus and to a serial output to said external communications circuitry through said chip interface circuitry, for accepting data in parallel format from said data control bus and appending to said data certain control and verification information, and for converting said data to a serial format and transmitting said serial data to said external communications circuitry;

wherein said interface circuitry forms a quadrilateral outer framework on said MOS chip; said ROM is disposed within one corner of said interface circuitry; said microcontroller is disposed adjacent to said ROM and along part of a first side of said interface circuitry; said DMA circuitry is disposed adjacent to said microcontroller, and within a second corner of said interface circuitry and along part of a second side thereof; said transmitter circuitry is disposed adjacent to said microcontroller and said DMA circuitry, and along part of a second side of said interface circuitry; said receiver circuitry is disposed adjacent to said transmitter circuitry, and within a third corner of said interface circuitry and along part of a third side thereof; said data access lines comprise part of said third side of said interface circuitry, and are disposed adjacent to said receiver circuitry; said timing/counting circuitry is disposed adjacent to said receiver circuitry and said data access lines and within the fourth corner of said interface circuitry; said read/write control circuitry comprises part of the fourth side of said interface circuitry, and is disposed adjacent to said receiver circuitry; said I/O registers are disposed adjacent to said timing/counting circuitry, said ROM, said microcontroller, and said read/write control circuitry; and said internal registers are disposed adjacent to said I/O registers, said ROM, and said microcontroller.

2. The MOS MPAC chip as recited in claim 1, wherein said chip is housed in a dual-in-line semiconductor package wherein the voltage supply pins $V_{CC}$, $V_{DD}$, and $V_{SS}$ are not symmetrically arranged around the perimeter of said semiconductor package in order to prevent damage to said MOS MPAC circuit if said semiconductor package is improperly inserted into a printed circuit board.

3. The MOS MPAC chip as recited in claim 1 wherein the circuitry of said chip is N-channel self-alligned silicon gate circuitry.

4. A metal oxide semiconductor (MOS) chip for a micro packet network interface circuit (MPAC) implementing a preselected packet network switching protocol, comprising chip interface circuitry, read/write control circuitry, timing/counting circuitry, input/output (I/O) registers, a microcontroller, read only memory (ROM), internal registers, a data control bus, data access lines, direct memory access (DMA) circuitry, receiver circuitry, and transmitter circuitry, all on a surface of said MOS chip, (a) said read/write control circuitry coupled to said chip interface circuitry, said timing/counting circuitry, and said I/O registers;

(b) said microcontroller coupled to said I/O registers, said ROM, said internal registers, and said data control bus;

(c) said data access lines coupled to said chip interface circuitry, said I/O registers, and said data control bus;

(d) said DMA circuitry coupled to said data control bus and said chip interface circuitry;

(e) said receiver circuitry coupled to said data control bus and said chip interface circuitry; and (f) said transmitter circuitry coupled to said data control bus and to said chip interface circuitry;

wherein said interface circuitry forms a quadrilateral outer framework on said MOS chip; said ROM is disposed within one corner of said interface circuitry; said microcontroller is disposed adjacent to said ROM and along part of a first side of said interface circuitry; said DMA circuitry is disposed adjacent to said microcontroller, and within a second corner of said interface circuitry and along part of a second side thereof; said transmitter circuitry is disposed adjacent to said microcontroller and said DMA circuitry, and along part of a second side of said interface circuitry; said receiver circuitry is disposed adjacent to said transmitter circuitry, and within a third corner of said interface circuitry and along part of a third side thereof; said data access lines comprise part of said third side of said interface circuitry, and are disposed adjacent to said receiver circuitry; said timing/counting circuitry is disposed adjacent to said receiver circuitry and said data access lines and within the fourth corner of said interface circuitry; said read/write control circuitry comprises part of the fourth side of said interface circuitry, and is disposed adjacent to said receiver circuitry; said I/O registers are disposed adjacent to said timing/counting circuitry, said ROM, said microcontroller, and said read/write control circuitry; and said internal registers are disposed adjacent to said I/O registers, said ROM, and said microcontroller.

* * * * *